United States Patent
Oh et al.

(10) Patent No.: US 9,502,646 B2
(45) Date of Patent: Nov. 22, 2016

(54) SEMICONDUCTOR INTEGRATED CIRCUIT DEVICE HAVING ENCAPSULATION FILM AND METHOD OF FABRICATING THE SAME

(71) Applicant: SK hynix Inc., Gyeonggi-do (KR)

(72) Inventors: Sang Chul Oh, Gyeonggi-do (KR); Hae Chan Park, Gyeonggi-do (KR); Se Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/688,717

(22) Filed: Apr. 16, 2015

(65) Prior Publication Data

US 2016/0190439 A1 Jun. 30, 2016

(30) Foreign Application Priority Data

Dec. 26, 2014 (KR) .................. 10-2014-0190936

(51) Int. Cl.
*H01L 45/00* (2006.01)

(52) U.S. Cl.
CPC .............. *H01L 45/12* (2013.01); *H01L 45/06* (2013.01); *H01L 45/1233* (2013.01); *H01L 45/1675* (2013.01); *H01L 45/143* (2013.01); *H01L 45/144* (2013.01); *H01L 45/148* (2013.01)

(58) Field of Classification Search
CPC . H01L 45/1226; H01L 27/249; H01L 45/12; H01L 45/06; H01L 45/1616; H01L 45/1633; H01L 45/1233; H01L 45/144; H01L 45/1675; H01L 45/148; G11C 2213/15; G11C 2213/56
USPC .......................................................... 438/385
See application file for complete search history.

(56) References Cited

U.S. PATENT DOCUMENTS

| | | | |
|---|---|---|---|
| 2010/0054015 A1* | 3/2010 | Lee | G11C 5/02 365/148 |
| 2010/0219392 A1* | 9/2010 | Awaya | H01L 27/2454 257/3 |
| 2013/0134371 A1 | 5/2013 | Park | |
| 2013/0200327 A1* | 8/2013 | Wang | H01L 45/04 257/4 |
| 2014/0061577 A1* | 3/2014 | Kanno | H01L 45/04 257/5 |

FOREIGN PATENT DOCUMENTS

KR 1020090102992 10/2009

* cited by examiner

*Primary Examiner* — Caridad Everhart
(74) *Attorney, Agent, or Firm* — IP & T Group LLP (57) ABSTRACT

A semiconductor integrated circuit device and a method of fabricating the same are disclosed. The semiconductor integrated circuit device includes a resistive layer and an encapsulation film formed to surround an outer wall of the resistive layer. The encapsulation film contains an oxygen absorbing ingredient.

17 Claims, 9 Drawing Sheets

SEMICONDUCTOR INTEGRATED CIRCUIT DEVICE HAVING ENCAPSULATION FILM AND METHOD OF FABRICATING THE SAME

CROSS-REFERENCES TO RELATED APPLICATION

This application claims priority under 35 U.S.C. 119(a) to Korean patent application No. 10-2014-0190936, filed on Dec. 26, 2014, in the Korean intellectual property Office, which is incorporated by reference in its entirety as set forth in full.

BACKGROUND

1. Technical Field

The inventive concept relates to a semiconductor integrated circuit device and a method of fabricating the same and, more particularly, to a semiconductor integrated circuit device having an encapsulation film and a method of fabricating the same.

2. Related Art

With the rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with high capacity, ultra-high speed, and ultra-low power consumption need to be developed.

Variable resistive memory devices using a resistive material are suggested as the next-generation of memory devices. Variable resistive memory devices include phase-change random access memory (PCRAM), resistive RAM (ReRAM), magneto-resistive RAMs (MRAM) and the like.

Variable resistive memory devices may include memory cells comprised of a switching device and a resistive device, and may store data "0" or "1" according to a set/reset state of the resistive device.

Even in resistive memory devices, the first priority is to improve integration density (i.e. to integrate as many memory cells as possible in a limited area).

A variable resistive layer constituting the resistive device, for example, a phase-change layer, may be formed in various structures. The shape of the phase-change layer may be defined by a patterning or burying method.

In the process of defining the shape of the phase-change layer, oxidation may occur, and thus the material properties of the phase-change layer may change.

SUMMARY

Various embodiments are directed to a semiconductor integrated circuit device having an encapsulation film, and a method of fabricating the same, capable of reducing changes in material properties of a resistive layer by preventing oxygen flow into the resistive layer.

According to an embodiment, a semiconductor integrated circuit device may include a resistive layer and an encapsulation film formed to surround an outer wall of the resistive layer. The encapsulation film may contain an oxygen absorbing ingredient.

According to an embodiment, a semiconductor integrated circuit device may include a plurality of resistive pillars, a plurality of encapsulation films formed to surround the respective resistive pillars, each including an oxygen absorbing layer, and a gap-fill insulating layer filled between resistive pillars.

According to an embodiment, a method of fabricating a semiconductor integrated circuit device may include forming a plurality of resistive pillars over a base layer, and forming a plurality of encapsulation films to surround the respective resistive pillars, each including an oxygen absorbing layer.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings. Exemplary embodiments are described herein with reference to cross-sectional illustrations that are schematic illustrations of exemplary embodiments and intermediate structures. As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made in these exemplary embodiments without departing from the principles and spirit of the inventive concept.

Figure 1:
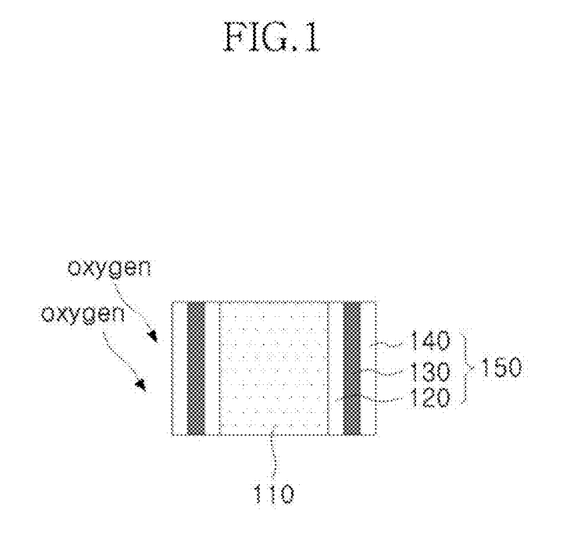
FIG. 1 is a cross-sectional view illustrating a semiconductor integrated circuit device according to an embodiment of the inventive concept.
Figure 2:
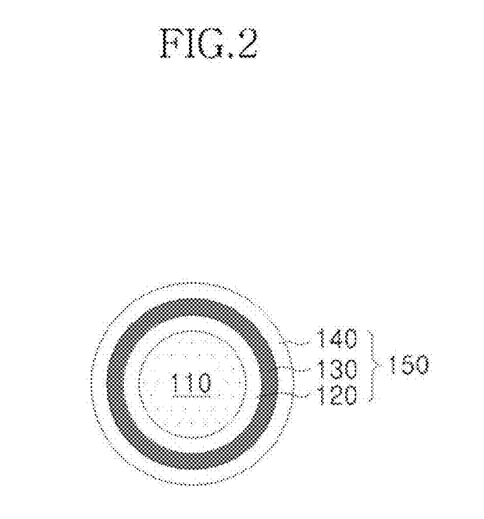
FIG. 2 is a plan view illustrating a semiconductor integrated circuit device according to an embodiment of the inventive concept.

FIG. 1 is a cross-sectional view illustrating a semiconductor integrated circuit device according to an embodiment of the inventive concept. FIG. 2 is a plan view illustrating a semiconductor integrated circuit device according to an embodiment of the inventive concept.

Referring to FIGS. 1 and 2, an encapsulation film 150 may be formed to surround an outer wall of a resistive layer 110. The resistive layer 110 may include, for example, a phase-change material layer. The resistive layer 110 may have a cylindrical shape, and the encapsulation film 150 may have a ring shape to surround the resistive layer 110.

The encapsulation film 150 may include a plurality of material layers. In particular, the encapsulation film 150 may include at least one oxygen absorbing layer 130. The oxygen absorbing layer 130 may be a material having an oxygen bonding force higher than an insulating layer. For example, the oxygen absorbing layer 130 may include a metal layer such as titanium (Ti) tantalum (Ta), or cobalt (Co), or a semiconductor layer such as germanium (Ge) or silicon (Si).

The encapsulation film 150 according to the embodiment may include a first insulating layer 120, the oxygen absorbing layer 130, and a second insulating layer 140. The first insulating layer 120 may be formed to surround the outer wall of the resistive layer 110, the oxygen absorbing layer 130 may be formed to surround an outer wall of the first insulating layer 120, and the second insulating layer 140 may be formed to surround an outer wall of the oxygen absorbing layer 130. The first and second insulating layers 120 and 140 may be, for example, a silicon oxide layer or a silicon nitride layer. Since the oxygen absorbing layer 130 containing a conductive material is interposed between the first and second insulating layers 120 and 140, even when the oxygen absorbing layer 130 contains a conductive material, the oxygen absorbing layer 130 may encapsulate.

The encapsulation film 150 may include the oxygen absorbing layer 130, which has high oxygen adsorption characteristics and absorbs most of the oxygen that penetrates when a gap-fill insulating layer (not shown) is formed in a subsequent process. Therefore, since the encapsulation film 150 may prevent oxygen from penetrating toward the resistive layer 110, changes in material properties of the resistive layer 110 may be reduced.

Figure 3:
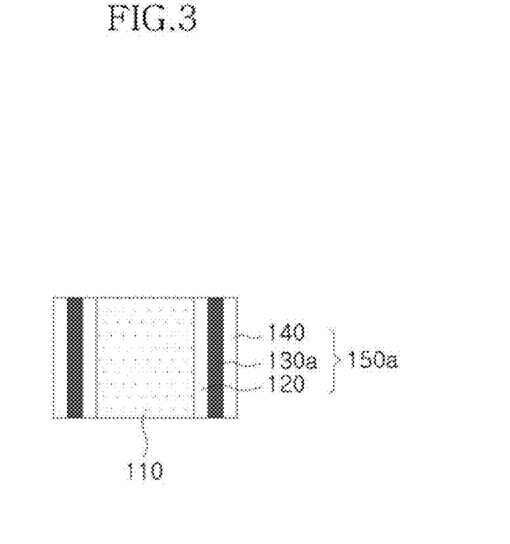
FIG. 3 is a cross-sectional view illustrating a semiconductor integrated circuit device according to an embodiment of the inventive concept.

FIG. 3 is a cross-sectional view illustrating a semiconductor integrated circuit device according to an embodiment of the inventive concept.

As shown in FIG. 3, when most of the oxygen penetrates in a subsequent gap-fill process, or the like is absorbed in the oxygen absorbing layer 130, the oxygen absorbing layer 130 may be modified into an oxide material 130a of an encapsulation film 150a.

Figure 4:
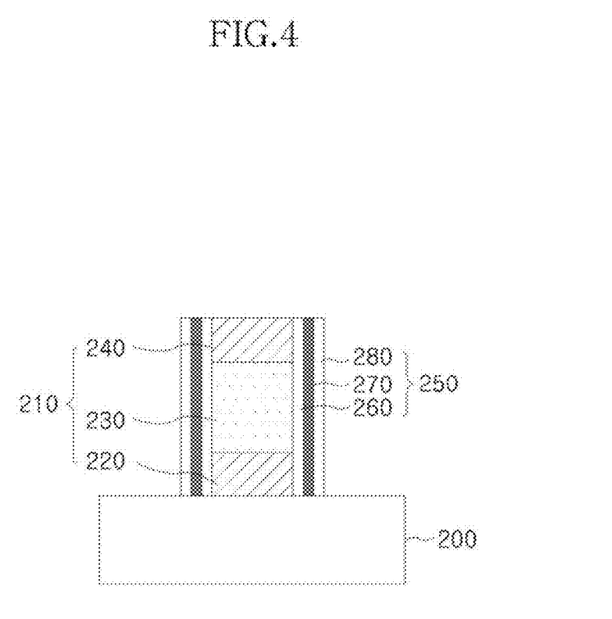
FIG. 4 is a cross-sectional view illustrating a semiconductor integrated circuit device according to an embodiment of the inventive concept.

FIG. 4 is a cross-sectional view illustrating a semiconductor integrated circuit device according to an embodiment of the inventive concept.

Referring to FIG. 4, a pillar structure 210 is formed over a base layer 200. The pillar structure 210 may include a lower electrode 220, a phase-change pattern 230, and an upper electrode 240. The lower electrode 220 may be formed below the phase-change pattern 230, and the upper electrode 240 may be formed over the phase-change pattern 230. The base layer 200 may be a semiconductor substrate including a switching device.

An encapsulation film 250 including an oxygen absorbing layer 270 is formed over an outer wall of the pillar structure 210. The encapsulation film 250 may include, for example, a first insulating layer 260, the oxygen absorbing layer 270, and a second insulating layer 280. The first and second insulating layers 260 and 280 may include, for example, a silicon oxide layer or a silicon nitride layer, and the oxygen absorbing layer 270 may include a metal material or a semiconductor material which is susceptible to an oxidation reaction.

The encapsulation film 250 according to the embodiment may be formed to surround the pillar structure 210 of the lower electrode, the phase-change pattern, and the upper electrode, so as to prevent oxygen from penetrating into the phase-change pattern 230 during a subsequent gap-fill process.

A method of fabricating a phase-change memory device according to an embodiment of the inventive concept will be described with reference to FIGS. 5 to 11.

FIGS. 5 to 11 are cross-sectional views illustrating a method of fabricating the semiconductor integrated circuit device according to an embodiment of the inventive concept.

Figure 5:
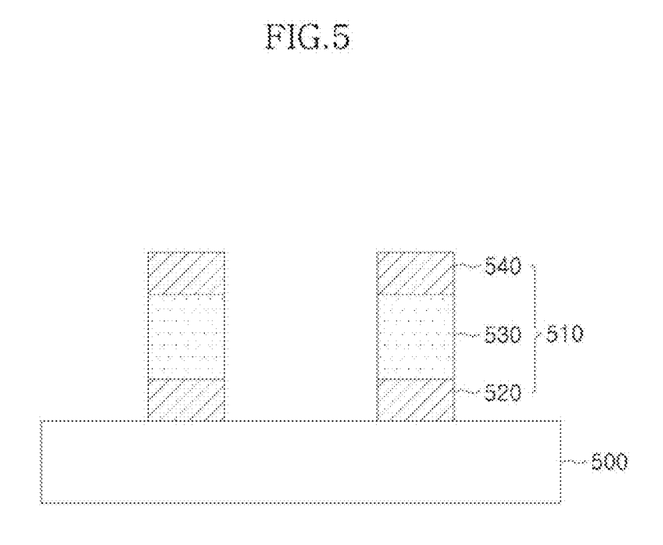
FIGS. 5 to 11 are cross-sectional views illustrating a method of fabricating a semiconductor integrated circuit device according to an embodiment of the inventive concept.

Referring to FIG. 5, a first conductive layer (not shown), a resistive layer (not shown), and a second conductive layer (not shown) are sequentially stacked over a base layer 500. The base layer 500 may include, for example, a substrate (not shown) having semiconductor properties, and a switching device (not shown) formed over the substrate. The switching device may include, for example, at least one of a diode, a two-dimensional (2D) metal-oxide semiconductor (MOS) transistor, and a three-dimensional (3D) MOS transistor.

The first and second conductive layers may include a metal layer such as tungsten (W), copper (Cu), titanium nitride (TiN) tantalum nitride (TaN), tungsten nitride (WN), molybdenum nitride (MoN) niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), Ti, molybdenum (Mo), Ta, titanium silicide (TiSi), titanium tungsten (TiW), titanium oxynitride (TiON), titanium aluminum oxynitride (TiAlON), tungsten oxynitride (WON), or tantalum oxynitride (TaON), or a semiconductor layer such as a doped polysilicon layer or a silicon germanium (SiGe) layer.

When the resistive layer is a phase-change material layer, the resistive layer may include various materials, that is, a material in which two elements are combined, such as GaSb, InSb, InSe, $Sb_2Te_3$, or GeTe, a material in which three elements are combined, such as GeSbTe, GaSeTe, InSbTe, $SnSb_2Te_4$, or InSbGe, or a material in which four elements are combined, such as AgInSbTe, (GeSn)SbTe, GeSb(SeTe), or $Te_{81}Ge_{15}Sb_2S_2$. Among the materials for the resistive layer, GeSbTe consisting of germanium (Ge), antimony (Sb), and tellurium (Te) may be used. When the resistive layer is a memory layer applied to a resistive memory cell, the resistive layer may include nickel oxide (NiO) or perovskite. The perovskite may be a composition such as manganite ($Pr_{0.7}Ca_{0.3}MnO_3$, $Pr_{0.5}Ca_{0.5}MnO_3$, PCMO, LCMO, or the like), titanate (STO:Cr), zirconate (SZO:Cr, $Ca_2Nb_2O_7$:Cr, or $Ta_2O_5$:Cr), or the like.

By patterning the second conductive layer, the resistive layer, and the first conductive layer, a pillar structure 510 including a lower electrode 520, a resistive pattern 530, and an upper electrode 540 is formed. The lower electrode 520 of the pillar structure 510 may be electrically coupled to the switching device.

Figure 6:
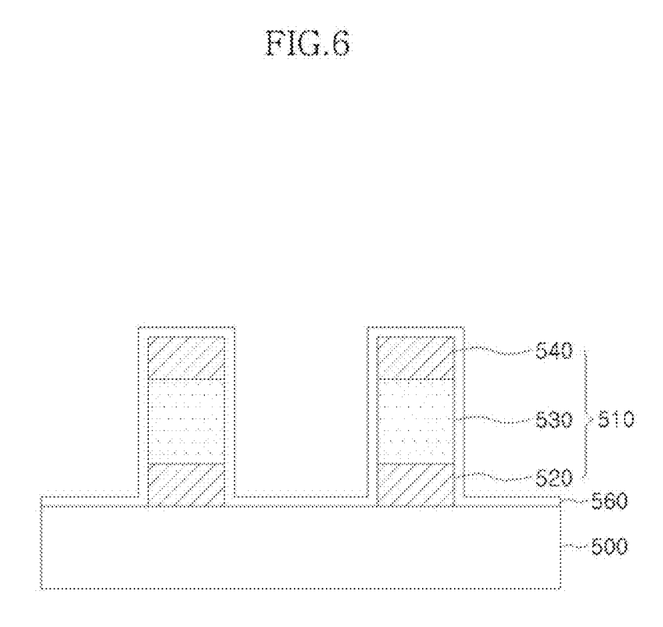

Referring to FIG. 6, a first insulating layer 560 is deposited along a resultant structure including the pillar structure 510 and the base layer 500. The first insulating layer 560 may be, for example, a silicon oxide layer or a silicon nitride layer.

Figure 7:
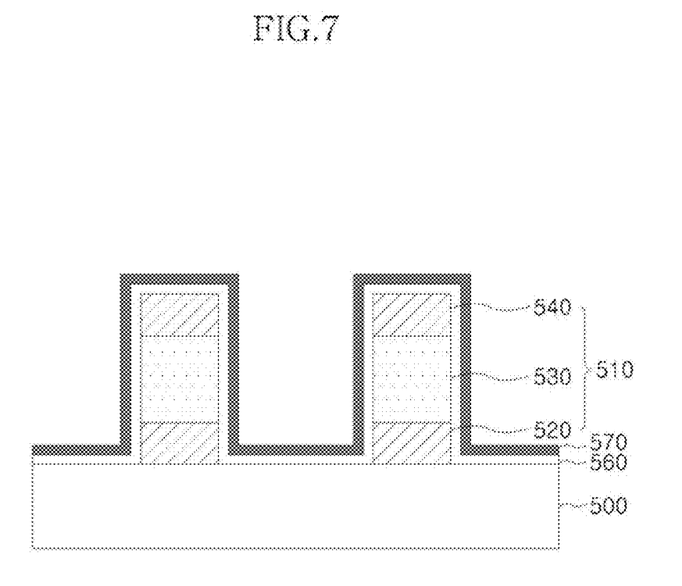

Referring to FIG. 7, an oxygen absorbing layer 570 is formed over the first insulating layer 560 with a conformal thickness. The oxygen absorbing layer 570 may be a conductive layer or a semiconductor layer having oxidation properties as described above.

Figure 8:
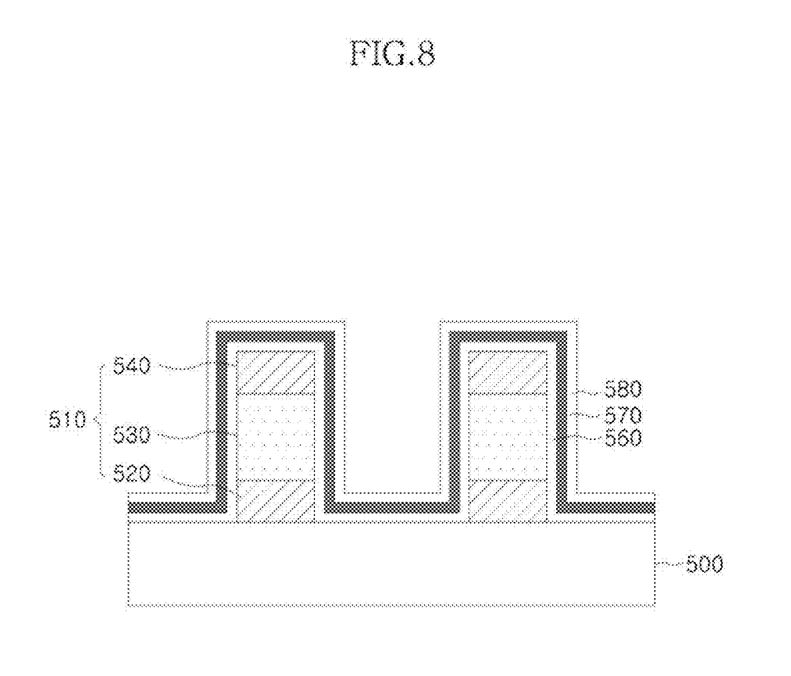

Referring to FIG. 8, a second insulating layer 580 is formed over the oxygen absorbing layer 570. The second insulating layer 580 may include the same insulating layer as the first insulating layer 560 or a different insulating layer from the first insulating layer 560. The second insulating layer 580 may include a silicon oxide layer or a silicon nitride layer.

Figure 9:
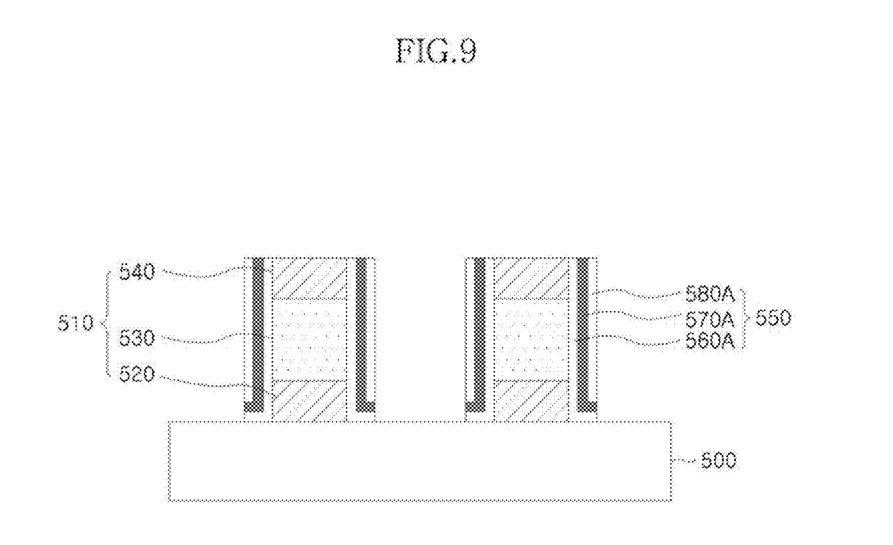

Referring to FIG. 9, by anisotropically etching the first insulating layer 560, the oxygen absorbing layer 570, and the second insulating layer 580, an encapsulation film 550 including a first insulating pattern 560A, an oxygen absorbing pattern 570A, and a second insulating pattern 580A may be formed to surround the pillar structure 510 so as to prevent impurities, oxygen, or the like from penetrating into the pillar structure 510. The encapsulation film 550 may be left over an outer wall of the pillar structure 510 as a spacer.

Figure 10:
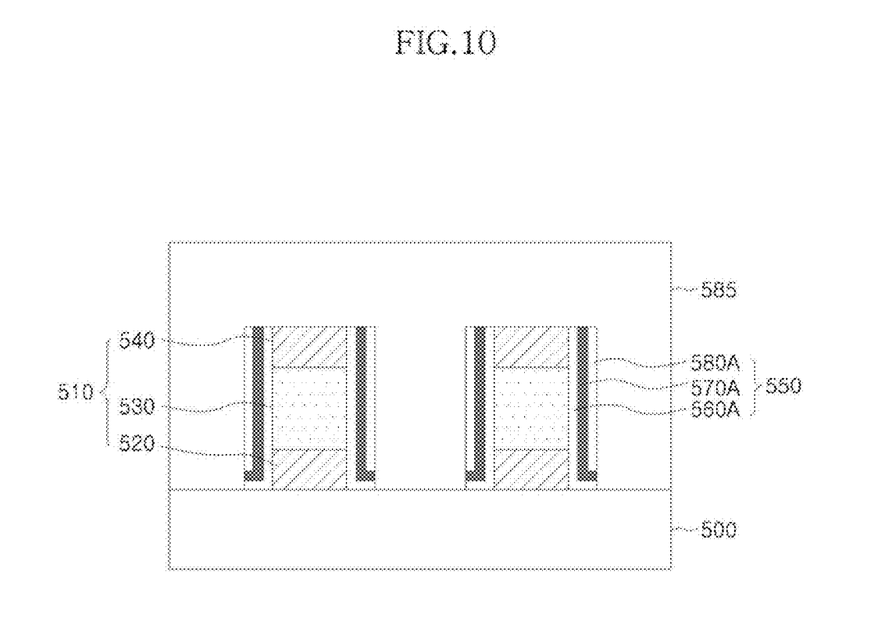

Referring to FIG. 10, a gap-fill insulating layer 585 is formed over a resultant structure including the pillar structure 510 and the encapsulation film 550 in such a manner that the pillar structures 510 are insulated from each other. The gap-fill insulating layer 585 may be sufficiently buried between the pillar structures 510. For example, the gap-fill insulating layer 585 may have a height greater than a height of the pillar structure 510. The gap-fill insulating layer 585 may include, for example, a spin on dielectric (SOD) layer.

Figure 11:
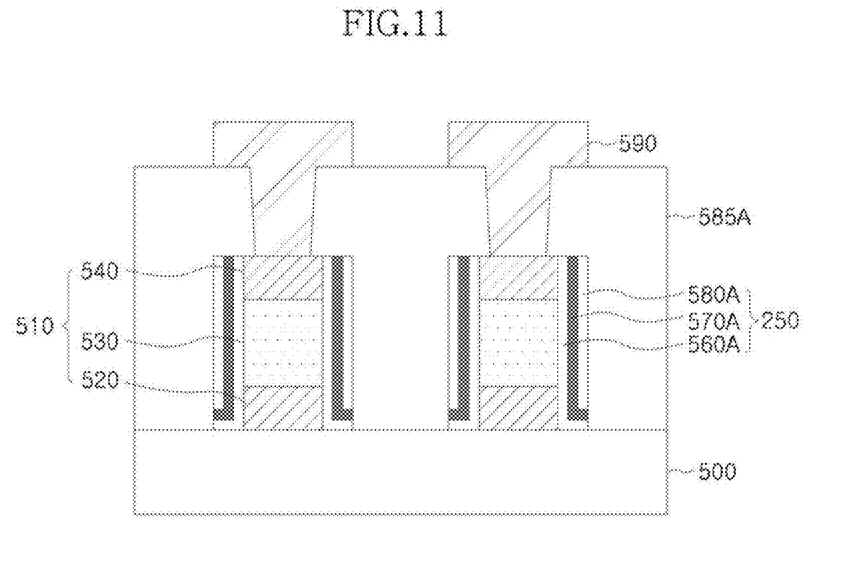

Referring to FIG. 11, the gap-fill insulating layer 585 is etched, to form a gap-fill insulating layer 585A, until a top surface of the upper electrode 540 of the pillar structure 510 is exposed. As a result, a bit line contact hole is formed. Thereafter, a conductive material (not shown) may fill the bit line contact hole to form a bit line 590.

A method of fabricating a phase-change memory device according to an embodiment of the inventive concept will be described with reference to FIGS. 12 to 14.

Figure 12:
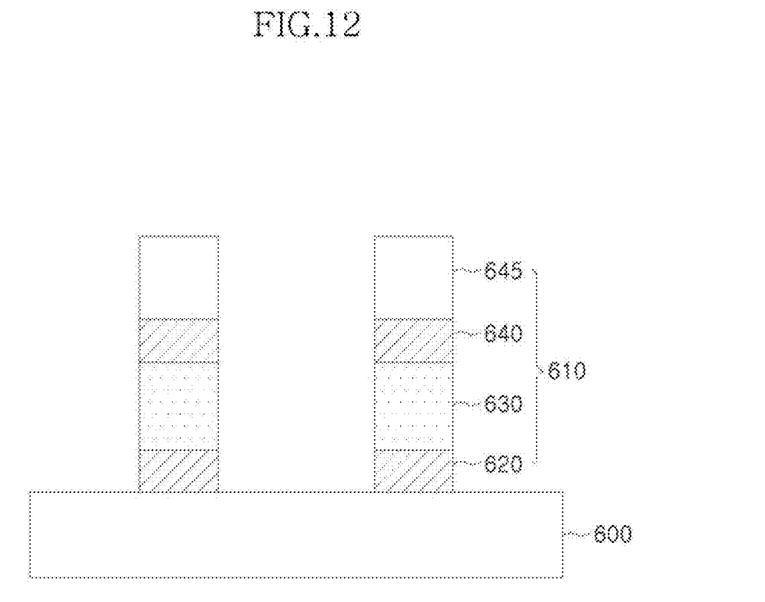
FIGS. 12 to 14 are cross-sectional views illustrating a method of fabricating a semiconductor integrated circuit device according to an embodiment of the inventive concept.
Figure 13:
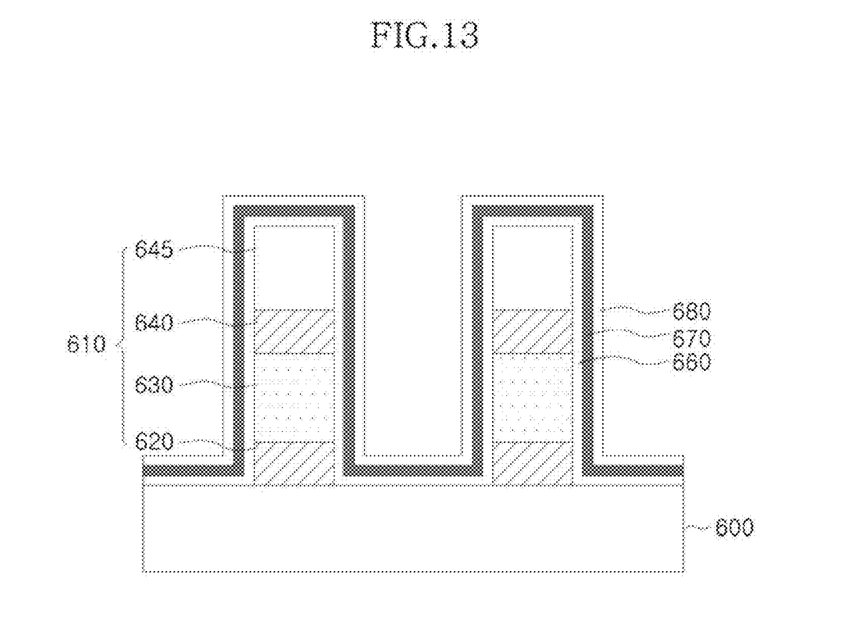
Figure 14:
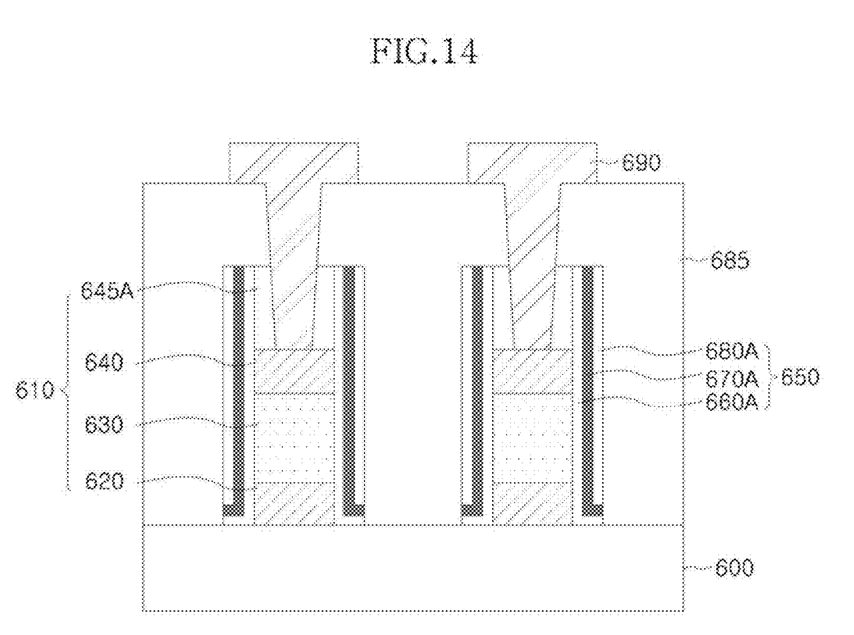

FIGS. 12 to 14 are cross-sectional views illustrating a method of fabricating a semiconductor integrated circuit device according to an embodiment of the inventive concept.

Referring to FIG. 12, a first conductive layer (not shown), a resistive layer (not shown), a second conductive layer (not shown), and a sacrificial layer (not shown) are sequentially stacked over a base layer 600. The first and second conductive layer may include, for example, a metal layer such as W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TiW, TiON, TiAlON, WON, or TaON, or a semiconductor layer such as a doped polysilicon layer or a SiGe layer.

When the resistive layer is a phase-change material layer, the resistive layer may include various materials, that is, a material in which two elements are combined, such as GaSb, InSb, InSe, $Sb_2Te_3$, or GeTe, a material in which three elements are combined, such as GeSbTe, GaSeTe, InSbTe, $SnSb_2Te_4$, or InSbGe, and a material in which four elements are combined, such as AgInSbTe, (GeSn)SbTe, GeSb(SeTe), or $Te_{81}Ge_{15}Sb_2S_2$. Among the materials for the resistive layer, GeSbTe consisting of germanium (Ge), antimony (Sb), and tellurium (Te) may be used. When the resistive layer is a memory layer applied to a resistive memory cell, the resistive layer may include nickel oxide (NiO) or perovskite. The perovskite may be a composition such as manganite ($Pr_{0.7}Ca_{0.3}MnO_3$, $Pr_{0.5}Ca_{0.5}MnO_3$, PCMO, LCMO, or the like), titanate (STO:Cr), zirconate (SZO:Cr, $Ca_2Nb_2O_7$:Cr, or $Ta_2O_5$:Cr), or the like.

The sacrificial layer may be formed to have a certain thickness, and may have an etch selectivity to layers constituting an encapsulation film to be formed in a subsequent process.

By patterning the sacrificial layer, the second conductive layer, the resistive layer, and the first conductive layer, a pillar structure 610 including a lower electrode 620, a resistive pattern 630, an upper electrode 640, and a sacrificial pattern 645 is formed. The lower electrode 620 may be electrically coupled to a switching device formed over the base layer 600.

Referring to FIG. 13, a first insulating layer 660 is deposited along a resultant structure including the pillar structure 610 and the base layer 600. The first insulating layer 660 may be, for example a silicon oxide layer or a silicon nitride layer.

An oxygen absorbing layer 670 may be formed over the first insulating layer 660 with a conformal thickness. The oxygen absorbing layer 670 may be a conductive layer or a semiconductor layer having oxidation properties as described above.

A second insulating layer 680 is formed over the oxygen absorbing layer 670. The second insulating layer 680 may include the same insulating layer as the first insulating layer 660 or a different insulating layer from the first insulating layer 660. The second insulating layer 680 in the embodiment may be a silicon oxide layer or a silicon nitride layer.

The first insulating layer 660, the oxygen absorbing layer 670, and the second insulating layer 680 may be formed in an in-situ manner, and may be formed through a low-temperature deposition method, for example, an atomic layer deposition (ALD) method.

Referring to FIG. 14, by anisotropically etching the first insulating layer 660, the oxygen absorbing layer 670, and the second insulating layer 680, an encapsulation film 650 including a first insulating pattern 660A, an oxygen absorbing pattern 670A, and a second insulating pattern 680A may be formed to surround the pillar structure 610 to prevent impurities, oxygen, or the like from penetrating into the pillar structure 610. The encapsulation film 650 may be left over an outer all of the pillar structure 610 in a spacer shape.

Then, a gap-fill insulating layer (not shown) is formed over a resultant structure including the pillar structure 610 and the encapsulation film 650 in such a manner that the pillar structures 610 are insulated from each other. The gap-fill insulating layer may be sufficiently buried between the pillar structures 610. The gap-fill insulating layer and the sacrificial pattern 645 are etched to form a gap-fill insulating layer 685 and a sacrificial pattern 645A, which expose a top surface of the upper electrode 640 of the pillar structure 610. As a result, a bit line contact hole is formed. Thereafter, a conductive material (not shown) may fill the bit line contact hole to form a bit line 690.

According to this embodiment, the encapsulation film includes the oxygen absorbing layer surrounding the resistive layer, such as a phase-change material layer. Therefore, oxygen materials which may penetrate during a subsequent process of forming a gap-fill insulating layer and other subsequent processes are combined into the oxygen absorbing layer, and thus the encapsulation film may prevent oxygen flow into the phase-change material layer. Therefore, electrical characteristics of the resistive memory device may be improved.

Figure 15:
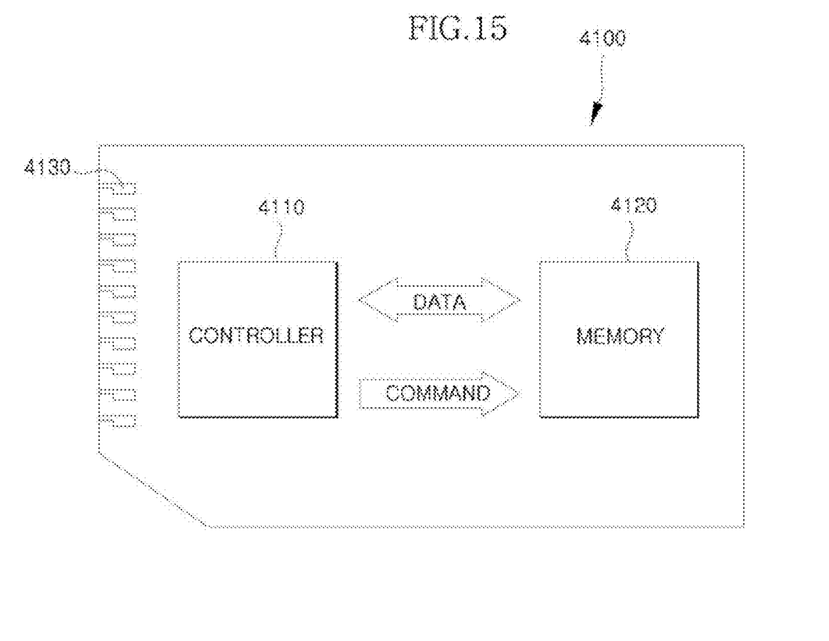
FIG. 15 is a schematic diagram illustrating a memory card system according to an embodiment of the inventive concept.

FIG. 15 is a schematic diagram illustrating a memory card system having a semiconductor integrated circuit device according to an embodiment of the present invention.

Referring to FIG. 15, the memory card system 4100 including a controller 4110, a memory 4120, and an interface member 4130 may be provided. The controller 4110 may be configured to exchange a command and/or data with the memory 4120. The memory 4120 may be used to store the command to be executed by the controller 4110 and/or user data.

The memory card system 4100 may store data in the memory 4120 or output data from the memory 4120 to outside (e.g. to an external device or host). The memory 4120 may include a semiconductor integrated circuit device according to any one of the above-described embodiments.

The interface member 4130 may serve to input and output data from and to the outside. The memory card system 4100 may be a multimedia card (MMC), a secure digital (SD) card or a portable data storage device.

Figure 16:
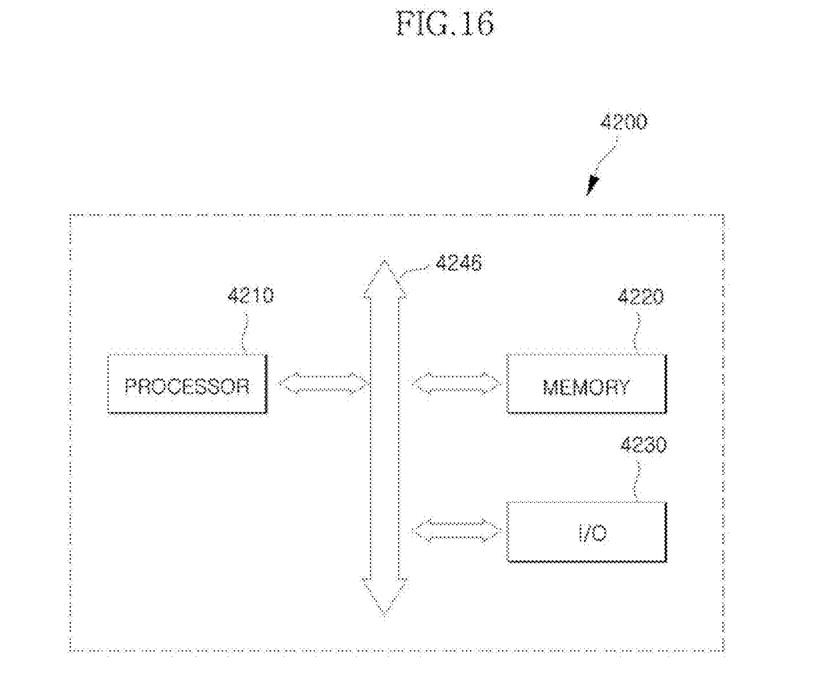
FIG. 16 is a block diagram illustrating an electronic system according to an embodiment of the inventive concept.

FIG. 16 is a block diagram illustrating an electronic system having a semiconductor integrated circuit device according to an embodiment of the present invention.

Referring to FIG. 16, the electronic system 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for an operation of the processor 4210. The memory 4220 may be used to store data to be accessed through the bus 4246.

The memory 4220 may include a semiconductor integrated circuit device according to any one of the above-described embodiments. For detailed realization and modification, additional circuits and control signals may be provided.

The electronic system 4200 may constitute various electronic control apparatuses which need the memory 4220. For example, the electronic system 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

Descriptions will be made below for the detailed realization and modified examples of the electronic system 4200, with reference to FIGS. 17 and 18.

Figure 17:
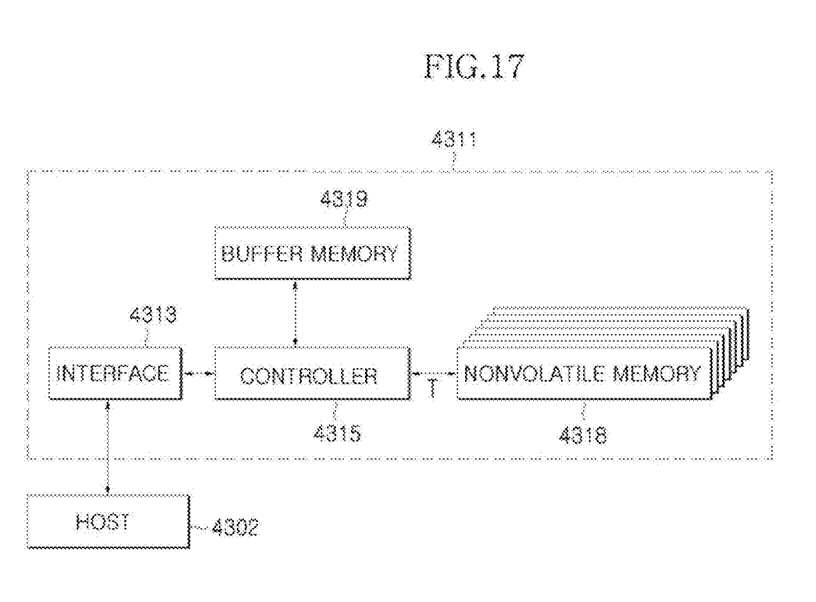
FIG. 17 is a block diagram illustrating a data storage apparatus according to an embodiment of the inventive concept.

FIG. 17 is a block diagram illustrating a data storage apparatus having a semiconductor integrated circuit device according to an embodiment of the present invention.

Referring to FIG. 17, the data storage apparatus 4311 such as a solid state disk (SSD) may be provided. The SSD 4311 may include an interface 4313, a controller 4315, a nonvolatile memory 4318, and a buffer memory 4319.

The SSD 4311 is an apparatus which stores information using a semiconductor device. The SW 4311 is faster, has a lower mechanical delay or failure rate, and generates less heat and noise than a hard disk drive (HDD). Further the SSD 4311 may be smaller and lighter than the HDD. The SSD 4311 may be widely used in a laptop PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302, and may serve to transmit and receive electrical signals such as data to and from the host 4302. For example, the interface 4313 may be a device which uses the same standard as a serial advanced technology attachment (SATA), an integrated drive electronics (IDE), a small computer system interface (SCSI), and/or a combination thereof. The nonvolatile memory 4318 may be electrically coupled to the interface 4313 via the controller 4315.

The nonvolatile memory 4318 may serve to store the data received through the interface 4313.

The nonvolatile memory 4318 may include a semiconductor integrated circuit device according to any one of the above-described embodiments. The nonvolatile memory 4318 can retain data stored therein even when the power supply to the SW 4311 is interrupted.

The buffer memory 4319 may include a volatile memory. The volatile memory may be a dynamic random access memory (DRAM) and/or a static RAM (SRAM). The buffer memory 4319 has relatively higher operation speed than the nonvolatile memory 4318.

The data processing speed of the interface 4313 may be relatively faster than the operation speed of the nonvolatile, memory 4318. The buffer memory 4319 may serve to temporarily store data. The data received through the interface 4313 may be temporarily stored in the buffer memory 4319 via the controller 4315, and then, may be permanently stored in the nonvolatile memory 4318 in conformity with the data recording speed of the nonvolatile memory 4318.

The data frequently used among the data stored in, the nonvolatile memory 4318 may be read in advance and may be temporarily stored in the buffer memory 4319. Namely, the buffer memory 4319 may serve to increase the effective operation speed of the SSD 4311 and reduce its error occurrence rate.

Figure 18:
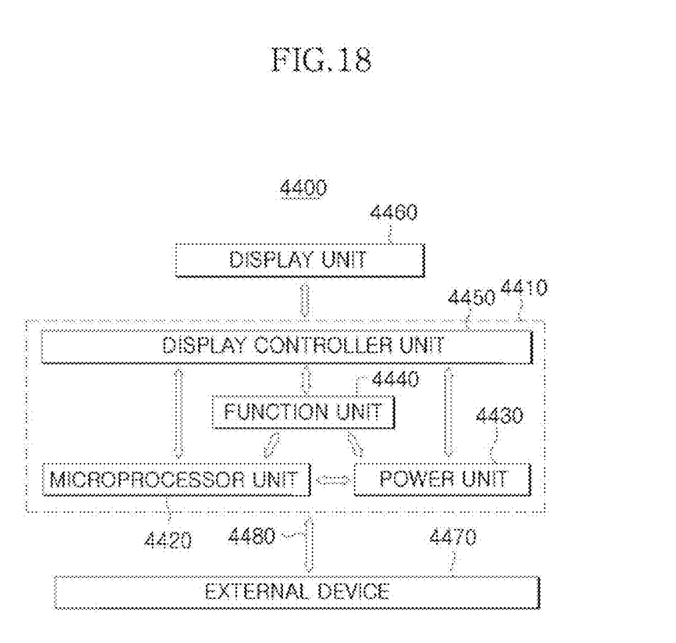
FIG. 18 is a block diagram illustrating an electronic system according to an embodiment of the inventive concept.

FIG. 18 is a block diagram illustrating an electronic system having a semiconductor integrated circuit device according to an embodiment of the present invention.

Referring to FIG. 18, the electronic system 4400 including a body 4410, a microprocessor unit 4420, a power unit 4430, a functional unit 4440, and a display controller unit 4450 may be provided.

The body 4410 may be a mother board which is formed of a printed circuit board (PCB). The microprocessor unit 4420, the power unit 4430, the functional unit 4440, and the display controller unit 4450 may be mounted on the body 4410. A display unit 4460 may be disposed inside the body 4410 or outside the body 4410. For example, the display unit 4460 may be disposed over a surface of the body 4410, and display an image processed by the display controller unit 4450.

The power unit 4430 may serve to receive a voltage from an external battery or the like, divide the voltage into desired voltage levels, and supply the divided voltages to the microprocessor unit 4420, the functional unit 4440, the display controller unit 4450, and so forth. The microprocessor unit 4420 may receive a voltage from the power unit 4430 and control the functional unit 4440 and the display unit 4460. The functional unit 4440 may perform various functions of the electronic system 4400. For example, when the electronic system 4400 is a portable phone, the functional unit 4440 may include various components capable of performing portable phone functions, e.g., outputting the image to the display unit 4460 or outputting a voice to a speaker, by dialing or communication with an external device 4470. When a camera is additionally mounted, the functional unit 4440 may serve as a camera image processor.

When the electronic system 4400 is electrically coupled to a memory card or the like to increase capacity, the functional unit 4440 may be a memory card controller. The functional unit 4440 may exchange signals with the external device 4470 through a wired or wireless communication unit 4480. When the electronic system 4400 needs a universal serial bus (USB) or the like to expand functions thereof, the functional unit 4440 may serve as an interface controller. Any one semiconductor integrated circuit device among the semiconductor integrated circuit devices according to the above-described embodiments may be applied to at least one of the microprocessor unit 4420 and the functional unit 4440.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a resistive layer; and
   an encapsulation film formed to surround an outer wall of the resistive layer, wherein the encapsulation film contains an oxygen absorbing ingredient,
   wherein the encapsulation film includes:
      a first insulating layer formed to surround the outer wall of the resistive layer;
      an oxygen absorbing layer formed to surround an outer wall of the first insulating layer; and
      a second insulating layer formed to surround an outer wall of the oxygen absorbing layer.

2. The semiconductor integrated circuit device of claim 1, wherein the oxygen absorbing ingredient includes at least one of a metal ingredient and a semiconductor ingredient.

3. The semiconductor integrated circuit device of claim 1, wherein the first and second insulating layers include a silicon nitride layer or a silicon oxide layer.

4. The semiconductor integrated circuit device of claim 1, wherein the oxygen absorbing layer includes at least one of a metal layer including titanium (Ti), tantalum (Ta), or cobalt (Co), and a semiconductor layer including germanium (Ge) or silicon (Si).

5. The semiconductor integrated circuit device of claim 1, further comprising:
   a lower electrode formed below the resistive layer; and
   an upper electrode formed over the resistive layer.

6. The semiconductor integrated circuit device of claim 5, wherein the encapsulation film is formed to surround an outer wall of the lower electrode, the resistive layer, and the upper electrode.

7. A semiconductor integrated circuit device comprising:
   a plurality of resistive pillars;
   a plurality of encapsulation films formed to surround the resistive pillars, wherein each of the encapsulation films includes an oxygen absorbing layer; and
   a gap-fill insulating layer filled between the resistive pillar,
   wherein each of the encapsulation films comprises:
      a first insulating layer formed to surround the resistive pillars;
      the oxygen absorbing layer formed to surround an outer wall of the first insulating layer; and
      a second insulating layer formed to surround an outer wall of the oxygen absorbing layer.

8. The semiconductor integrated circuit device of claim 7, wherein each of the resistive pillars includes a phase-change material layer.

9. The semiconductor integrated circuit device of claim 7, wherein each of the resistive pillars includes a stacked structure of a lower electrode, a phase-change pattern, and an upper electrode.

10. The semiconductor integrated circuit device of claim 7, wherein the oxygen absorbing layer includes at least one of a metal layer including titanium (Ti), tantalum (Ta), or cobalt (Co), and a semiconductor layer including germanium (Ge) or silicon (Si).

11. The semiconductor integrated circuit device of claim 7, wherein the first and second insulating layers include a silicon oxide layer or a silicon nitride layer.

12. The semiconductor integrated circuit device of claim 9, further comprising:
    a bit line formed over the gap-fill insulating layer and in contact with the upper electrode.

13. A method of fabricating a semiconductor integrated circuit device, the method comprising:
    forming a plurality of resistive pillars over a base layer; and
    forming a plurality of encapsulation films to surround the resistive pillars, each including an oxygen absorbing layer,
    wherein the forming of the plurality of encapsulation films includes:
       forming a first insulating layer along a resultant structure including the resistive pillars;
       forming the oxygen absorbing layer over the first insulating layer;
       forming a second insulating layer over the oxygen absorbing layer; and
       etching the insulating layer, the oxygen absorbing layer, and the second insulating layer to form the encapsulation films.

14. The method of claim 13, wherein the first and second insulating layers include a silicon oxide layer or a silicon nitride layer.

15. The method of claim 13, wherein the oxygen absorbing layer includes at least one of a metal layer including titanium (Ti), tantalum (Ta), or cobalt (Co), and a semiconductor layer including germanium (Ge) or silicon (Si).

16. The method of claim 13, wherein the first insulating layer, the oxygen absorbing layer, and the second insulating layer are formed by a low-temperature atomic layer deposition (ALD) method.

17. The method of claim 13, further comprising:
forming a gap-fill insulating layer over a resultant structure including the resistive pillars and the encapsulation films;
forming a contact hole by etching the gap-fill insulating layer until a top surface of the resistive pillars is exposed; and
forming a bit line over the gap-fill insulating layer to fill the contact hole.

* * * * *